United States Patent
Rachkov

(10) Patent No.: US 8,550,523 B2
(45) Date of Patent: Oct. 8, 2013

(54) PICK AND PLACE SYSTEM

(75) Inventor: Rossen Atanassov Rachkov, Kenmore, WA (US)

(73) Assignee: Data I/O Corporation, Redmond, WA (US)

( * ) Notice: Subject to any disclaimer, the term of this patent is extended or adjusted under 35 U.S.C. 154(b) by 483 days.

(21) Appl. No.: 12/136,310

(22) Filed: Jun. 10, 2008

(65) Prior Publication Data

US 2008/0315603 A1 Dec. 25, 2008

Related U.S. Application Data

(60) Provisional application No. 60/945,885, filed on Jun. 22, 2007.

(51) Int. Cl.
*A47J 45/00* (2006.01)

(52) U.S. Cl.
USPC .................. 294/183; 294/185; 414/752.1

(58) Field of Classification Search
USPC ....... 294/64.1, 183, 185, 189, 65; 414/752.1, 414/737, 627
See application file for complete search history.

(56) References Cited

U.S. PATENT DOCUMENTS

| | | | |
|---|---|---|---|
| 3,475,805 A * | 11/1969 | Rottmann | 29/714 |
| 4,470,134 A | 9/1984 | McNeel | |
| 4,556,362 A * | 12/1985 | Bahnck et al. | 414/744.3 |
| 5,422,554 A * | 6/1995 | Rohde | 318/568.21 |
| 5,649,804 A | 7/1997 | Schychuck | |
| 5,839,187 A * | 11/1998 | Sato et al. | 29/743 |
| 5,864,944 A * | 2/1999 | Kashiwagi et al. | 29/833 |
| 6,211,591 B1 | 4/2001 | Kowalski et al. | |
| 6,364,387 B1 | 4/2002 | Bolotin et al. | |
| 6,435,582 B1 | 8/2002 | DaSilva et al. | |
| 6,467,824 B2 | 10/2002 | Bolotin et al. | |
| 6,608,724 B2 | 8/2003 | Liu et al. | |
| 6,719,174 B1 * | 4/2004 | Swift | 222/333 |
| 6,769,172 B2 * | 8/2004 | Suhara et al. | 29/740 |
| 6,786,692 B2 * | 9/2004 | Manini | 414/13 |
| 6,839,959 B1 * | 1/2005 | Hosotani et al. | 29/740 |
| 7,146,718 B2 | 12/2006 | Thuerlemann | |
| 7,261,350 B2 * | 8/2007 | Isetani et al. | 294/185 |
| 7,471,019 B2 * | 12/2008 | Motherway | 310/16 |
| 7,484,782 B2 * | 2/2009 | Rich | 294/64.1 |
| 7,650,691 B2 * | 1/2010 | Narita et al. | 29/832 |
| 2002/0008053 A1 | 1/2002 | Hansen et al. | |
| 2004/0042890 A1 | 3/2004 | Hirata | |
| 2005/0257633 A1 | 11/2005 | Yamagishi | |

* cited by examiner

*Primary Examiner* — Stephen Vu

(74) *Attorney, Agent, or Firm* — Ishimaru & Associates LLP

(57) ABSTRACT

A pick and place system including: moving a vacuum probe in a linear direction using a linear actuator system, moving the vacuum probe in a rotary direction using a rotary actuator system, and applying a vacuum to the vacuum probe to pick up a micro-device after moving the vacuum probe in the linear direction or rotary direction for pickup and movement of the micro-device.

20 Claims, 5 Drawing Sheets

1

PICK AND PLACE SYSTEM

CROSS-REFERENCE TO RELATED APPLICATION(S)

This application claims the benefit of U.S. Provisional Patent Application Ser. No. 60/945,885 filed on Jun. 22, 2007.

TECHNICAL FIELD

The present invention relates generally to manufacturing systems for micro-devices and more particularly to pick and place systems for such manufacturing systems.

BACKGROUND ART

Certain operations of electronic circuit board assembly are performed away from the main production assembly lines. While various feeder machines and robotic handling systems populate electronic circuit boards with integrated circuits, the operations related to processing integrated circuits, such as programming, testing, calibration, and measurement are generally performed in separate areas on separate equipment rather than being integrated into the main production assembly lines.

For example, in the programming of programmable devices such as electrically erasable programmable read-only memories (EEPROMs) and Flash EEPROMs, separate programming equipment is used which is often located in a separate area from the circuit board assembly lines. There were two main reasons why programming is done off-line: equipment size and programming speed limitations.

Conventional chip programming equipment is relatively large and bulky because of the need to accurately insert and remove programmable devices at high speeds into and out of programming sockets in the programmer. Since insertion and removal requires relatively long traverses at high speed and very precise positioning, very rigid robotic handling equipment is required. This rigidity requirement means that the various components have to be relatively massive with strong structural support members to maintain structural integrity and precision positioning of the pick and place system moving at high speeds. Due to the size of the programming equipment and the limited space for the even larger assembly equipment, they are located in different areas.

The second reason why programming is generally done off line is that programming speed severely limits the throughput of the assembly line. A single high-speed production assembly system can assemble programmed devices faster than they can be programmed on a single programming mechanism. This programming speed limitation is addressed by programming the devices using a number of off-line programming systems, which are generally operated for longer periods of time in order to have a reserve of programmed devices for the production assembly systems. This mode of operation means that the operating times and the input requirements are different between the two systems.

Due to these two limitations, no one has been able to build a single system, which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards is that it was difficult to have two separate processes running in different areas and to coordinate between the two separate systems.

Often, the production assembly line runs out of programmable devices and the entire production assembly line would have to be shut down. At other times, the programming equipment is used to program a sufficient inventory of programmed devices to assure that the production assembly line is not be shut down; however, this mode of operation increases inventory costs.

Further problems are created when the programming has to be changed and there is a large inventory of programmed integrated circuits on hand. In this situation, the inventory of programmable devices would have to be reprogrammed, resulting in a waste of time and money.

While it is apparent that a better system with fast, on-line programming is desirable, there are several apparently insurmountable challenges in accomplishing this level of integration. Assuming that a sufficiently fast programming device can be seamlessly be integrated within an assembly system, one remaining challenge is designing a compact pick and place component handling system that can accurately pickup, move, and release small components such as micro-devices.

Thus, a need still remains for a compact pick and place small-component handling system that can be easily integrated within an assembly line. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a pick and place system including: moving a vacuum probe in a linear direction using a linear actuator system, moving the vacuum probe in a rotary direction using a rotary actuator system, and applying a vacuum to the vacuum probe to pick up a micro-device after moving the vacuum probe in the linear direction or rotary direction for pickup and movement of the micro-device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
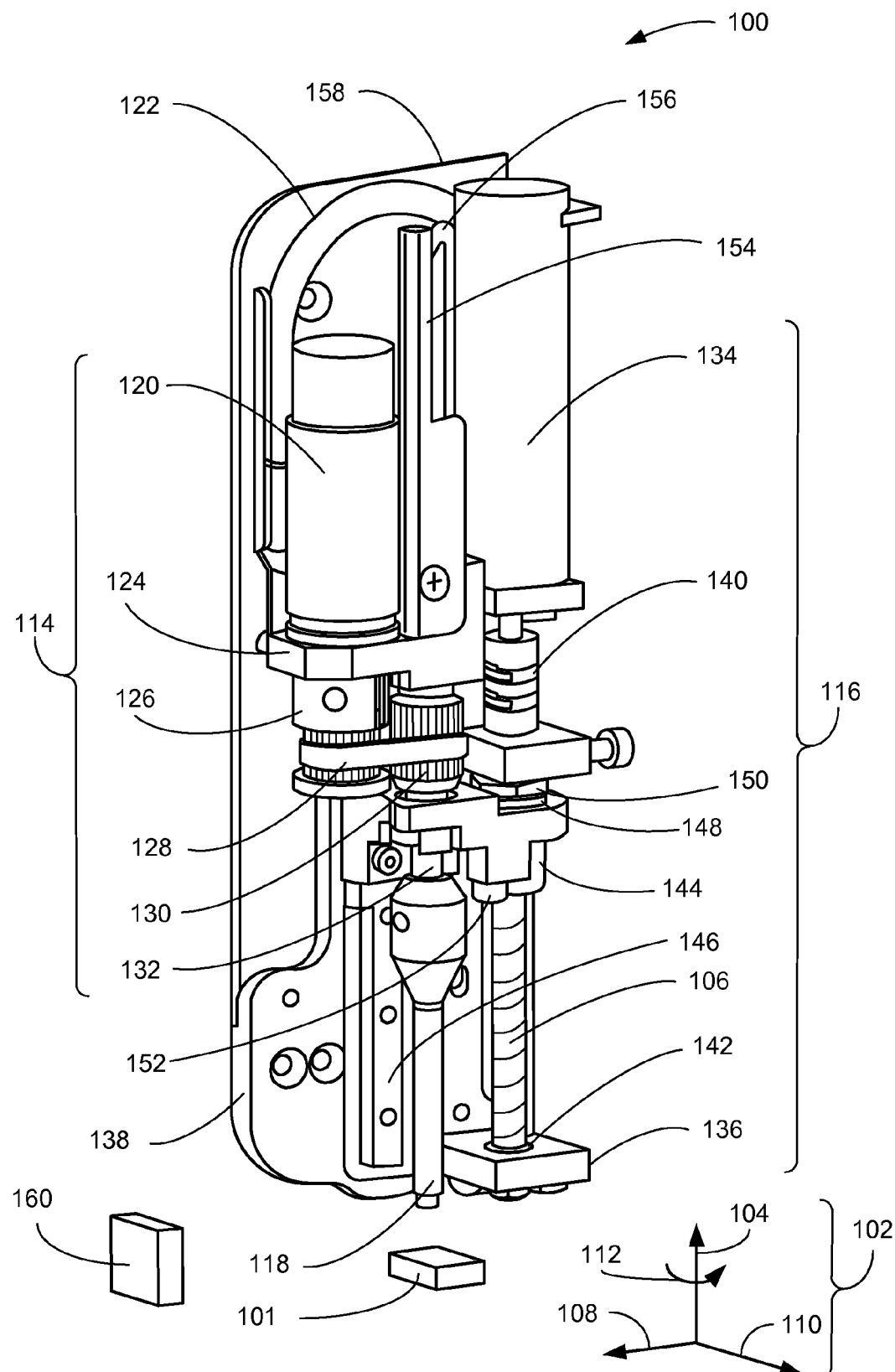
FIG. 1 is an isometric view of a pick and place system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals.

For expository purposes, the term "system" as used herein refers to and is defined as the method and as the apparatus of the present invention in accordance with the context in which the term is used. The term "on" means that there is direct contact among elements.

Referring now to FIG. 1, therein is shown an isometric view of a pick and place system 100 in accordance with an embodiment of the present invention. The pick and place system 100 is designed to function as a component handling mechanism for a micro-device 101. The term "micro-device" as used herein is defined as any sub-millimeter to multi-decimeter size component, including electronic, pneumatic, mechanical, or optical components among others. The micro-device 101 may be any component that may be incorporated into a semiconductor device package, circuit board, optical component, or any mechanical, electrical, or optical assembly or subassembly.

A local coordinate system 102 is defined for expository purposes. The local coordinate system 102 is a right-handed orthogonal system with a z-axis 104 parallel with the axis of symmetry of a z-axis leadscrew 106 in the pick and place system 100. An x-axis 108 and a y-axis 110 are accordingly defined following the right-handed orthogonal convention. A theta angular direction 112 is defined as the angular direction with an axis of symmetry parallel to the z-axis 104. The orientation of the local coordinate system 102 is only tied to the orientation of the pick and place system.

The term "linear direction" as used herein refers to a direction parallel to the z-axis 104 in the positive or negative directions. Similarly, the term "rotary direction" as used herein refers to an angular direction with an axis of rotation parallel to the theta angular direction 112 in the counterclockwise or clockwise directions.

The pick and place system 100 provides two-degree of freedom motion through a rotary actuator system 114 and a linear actuator system 116. In addition, the pick and place system 100 includes means for applying a vacuum through a vacuum probe 118. The vacuum source (not shown) may be external to the pick and place system 100 or may be provided by an external pneumatic Venturi mechanism (not shown).

The pick and place system 100 is able to provide both rotary movement to the micro-device 101 it handles as well has linear movement with a vacuum pickup. These combined capabilities provide proper pickup, movement, and release of the micro-device 101. Additional degrees of freedom may be provided, for example, by placing the components on a two or three degree of freedom stage (not shown) underneath the pick and place system 100.

Furthermore, it was unexpectedly discovered that the pick and place system 100 can be implemented employing small components, and that the configuration of the pick and place system 100 provides precise rotary and linear movement of the components it handles. Thus, the pick and place system 100 is portable, allows "plug and play" operation with only external electric and air power, provides precise handling, and is able to present programmed programmable devices to an automated production assembly line.

The rotary actuator system 114 is driven by a theta motor 120 that is connected to an electrical source of power (not shown) through a motor cable 122. The theta motor 120 may be a stepper motor or any other actuator imparting rotary motion. The theta motor 120 is supported by a motor carriage 124.

Rotary motion in the theta angular direction 112 (counterclockwise or clockwise) is transmitted to the vacuum probe 118 through a driving pulley 126, a timing belt 128, and a driven pulley 130 attached to a drive spindle 132. In addition to the theta motor 120, the motor carriage 124 supports the driving pulley 126, the driven pulley 130, and the drive spindle 132. The vacuum probe 118 can have a rotary movement in the theta angular direction 112 around an axis of symmetry of the vacuum probe 118 of FIG. 5.

The linear actuator system 116 is driven by a z-axis motor 134 that is mounted to a z-axis housing 136 which in turn is attached to a base plate 138. The z-axis motor 134 may be a brushless servo motor or any other actuator imparting rotary motion. The z-axis motor 134 is connected to the z-axis leadscrew 106 through a coupler 140.

The z-axis leadscrew 106 is supported by a bearing 142 attached to the z-axis housing 136. Linear motion of the rotary actuator system 114 is provided by the traverse of a leadscrew nut 144, which is connected to the motor carriage 124, up and down on the z-axis leadscrew 106. The motor carriage 124 slides over a linear guide 146 thus constraining the motion of the motor carriage 124 to a direction parallel to the z-axis 104.

The leadscrew nut 144 is secured to the motor carriage 124 through a semi-rigid connection using a washer 148, a jam nut 150, and two O-rings (not shown). Thus the leadscrew 144 moves the motor carriage 124 and every element that is attached to it including the driving pulley 126, the driven pulley 130, the drive spindle 132, and the vacuum probe 118. The downward motion of the leadscrew nut 144 is limited by contact of a bumper 152 against the z-axis housing 136. Other elements of the pick and place system 100 shown in FIG. 1 include a vacuum line bracket 154, a vacuum line 156, and a rear cover 158.

In one embodiment of the invention, the pick and place system 100 includes a sensor cluster 160 for sensing the position of the micro-device 101 before it is moved by the pick and place system 100. The sensor cluster 160 may incorporate an optical sensor such as a CMOS or CCD camera.

Figure 2:
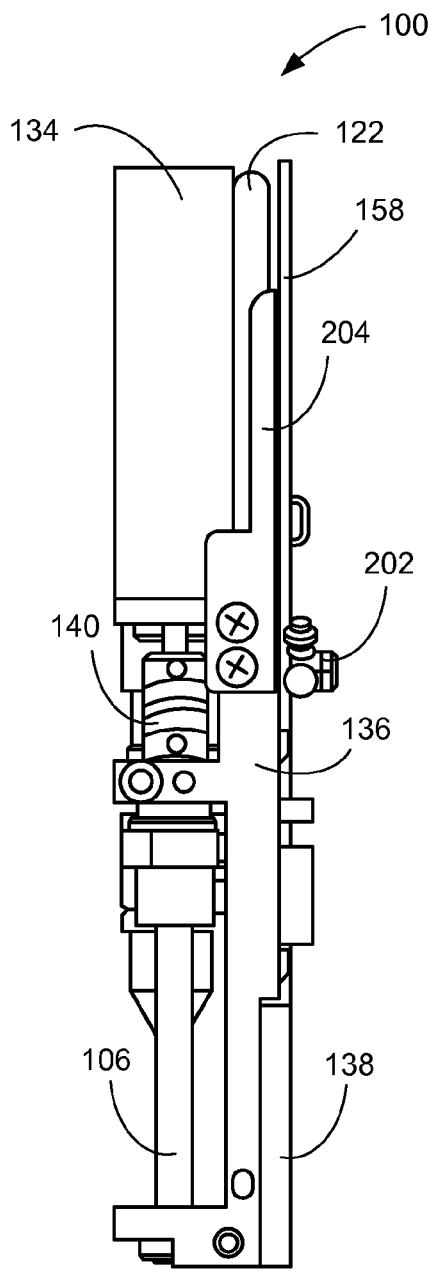
FIG. 2 a side view of the pick and place system of FIG. 1.

Referring now to FIG. 2, therein is shown a side view of the pick and place system 100 of FIG. 1. The side view of FIG. 2 predominately shows the linear actuator system 116 of FIG. 1, including the z-axis motor 134, the coupler 140, the z-axis housing 136, and the z-axis leadscrew 106. A vacuum fitting 202 provides a connection to external vacuum source (not shown) to the vacuum line 156 shown in FIG. 1. A bracket 204 attached to the z-axis housing 136 guides the motor cable 122. The rear cover 158 covers the base plate 138 and the rear portions of the pick and place system 100.

Figure 3:
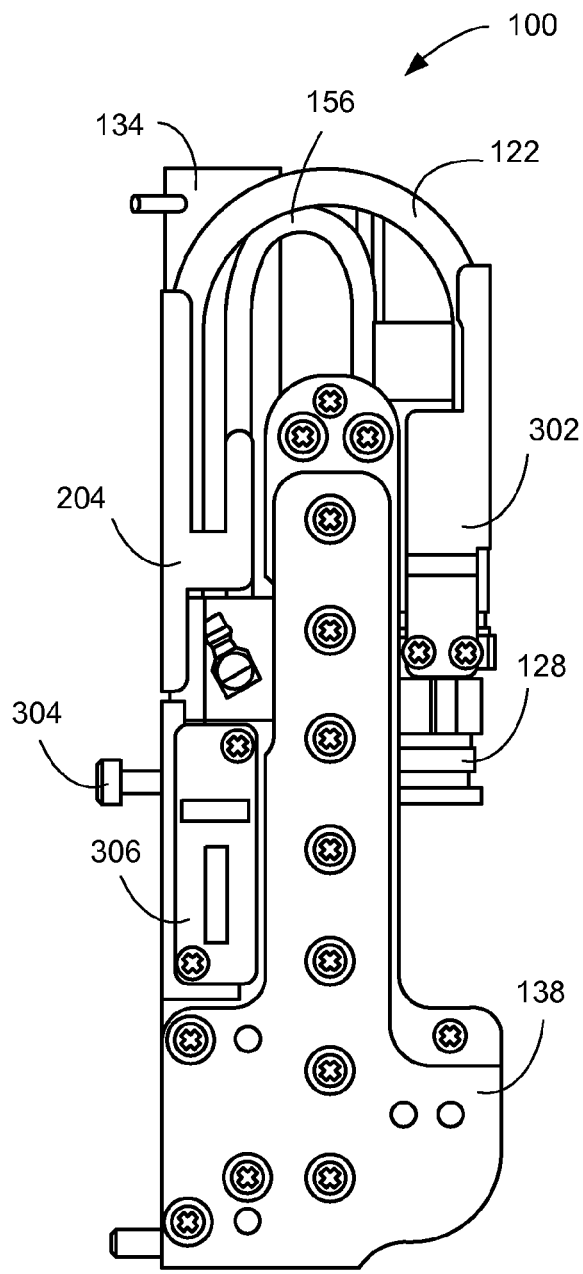
FIG. 3 is a rear view of the pick and place system of FIG. 1 with the rear cover not shown.

Referring now to FIG. 3 therein is shown a rear view of the pick and place system 100 of FIG. 1 with the rear cover 158 not shown. The base plate 138 provides the main structural support for the pick and place system 100. The motor cable 122 is held to a plate 302 and to the bracket 204 using shrink wrap (not shown). Similarly, a sleeve of shrink wrap (not shown) is used to hold the vacuum line 156 to the bracket 204. In addition, a locking bolt 304 threaded through the z-axis housing 136 is provided. A portion of the timing belt 128 and the z-axis motor 134 can be seen from the rear view in FIG. 3.

The pick and place system 100 also contains various sensors including a home sensor 306 that is used to determine the top position of the motor carriage 124. The home sensor 306 is a circuit board mounted proximity sensor. The rotary angle of the vacuum probe 118 (not shown) is determined from the theta motor 120 of FIG. 1. Thus, the pick and place system 100 provides accurate feedback-controlled linear and rotary motion of the vacuum probe 118 of FIG. 1.

Figure 4:
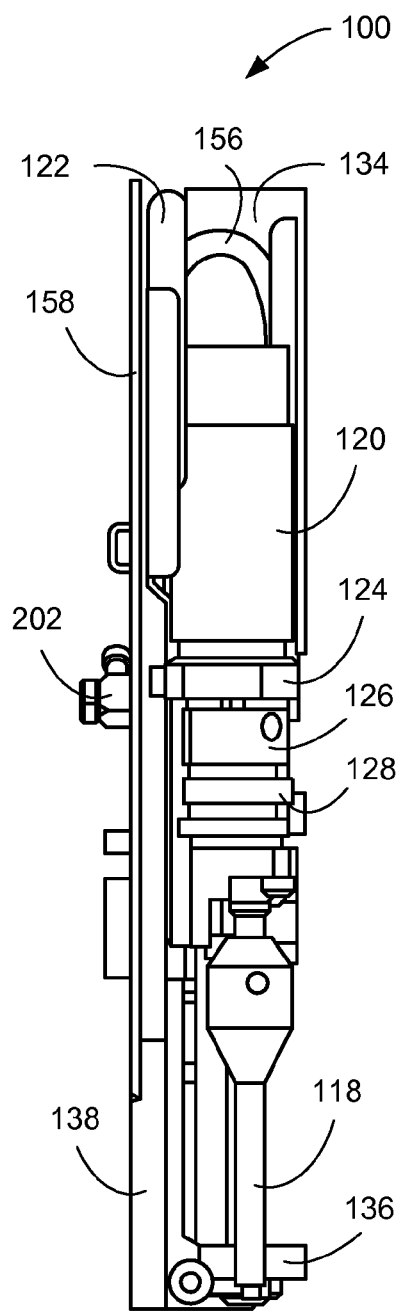
FIG. 4 is a side view of the pick and place system of FIG. 1.

Referring now to FIG. 4, therein is shown side view of the pick and place system 100 of FIG. 1. The side view of FIG. 4 predominately shows the rotary actuator system 114 of FIG. 1, including the theta motor 120, the motor carriage 124, the driving pulley 126, the timing belt 128, and the vacuum probe 118. Also shown is the z-axis housing 136, the base plate 138, the motor cable 122, the vacuum line 156, the z-axis motor 134, the rear cover 158, and the vacuum fitting 202.

Figure 5:
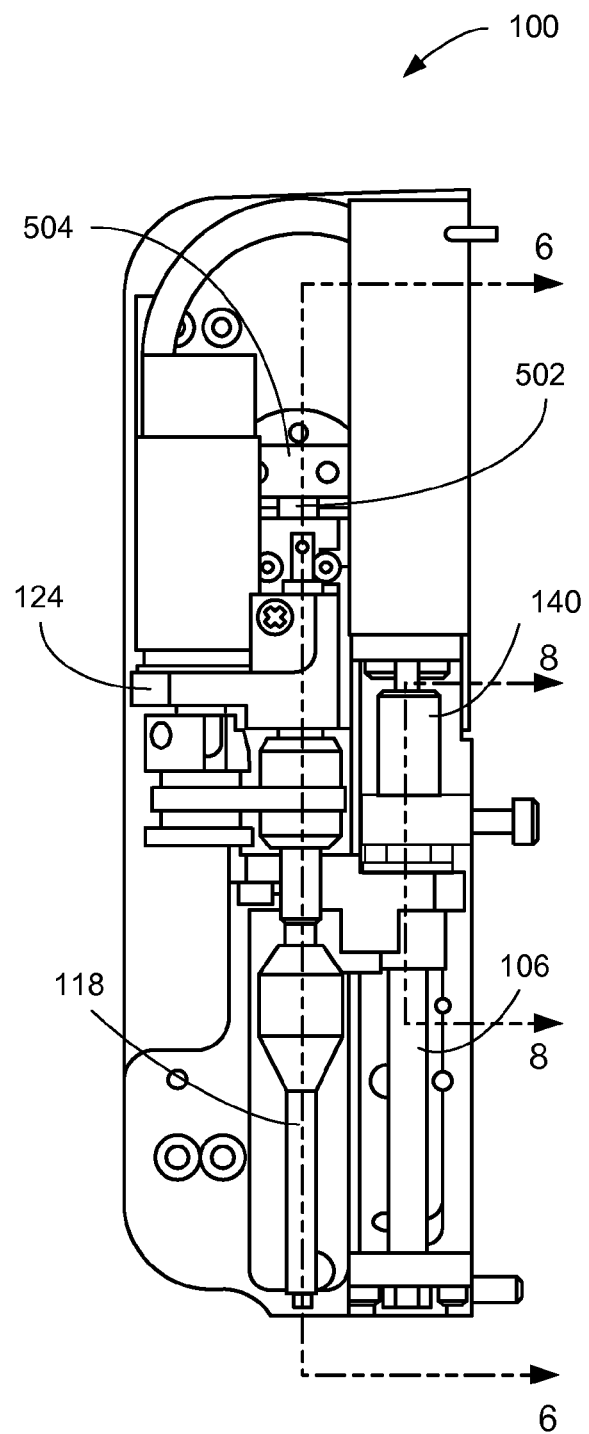
FIG. 5 is a front view of the pick and place system of FIG. 1 with the vacuum bracket and the vacuum line removed.

Referring now to FIG. 5, therein is shown a front view of the pick and place system 100 of FIG. 1 with the vacuum line bracket 154 and the vacuum line 156 removed. The position of cross-section line 6-6 coincides with the axis of symmetry of the vacuum probe 118, and the position of cross-section line 8-8 is aligned to the axis of symmetry of the coupler 140 and the z-axis leadscrew 106. A top bumper 502 held in place by a stop block 504 limits the upward motion of the motor carriage 124.

Figure 6:
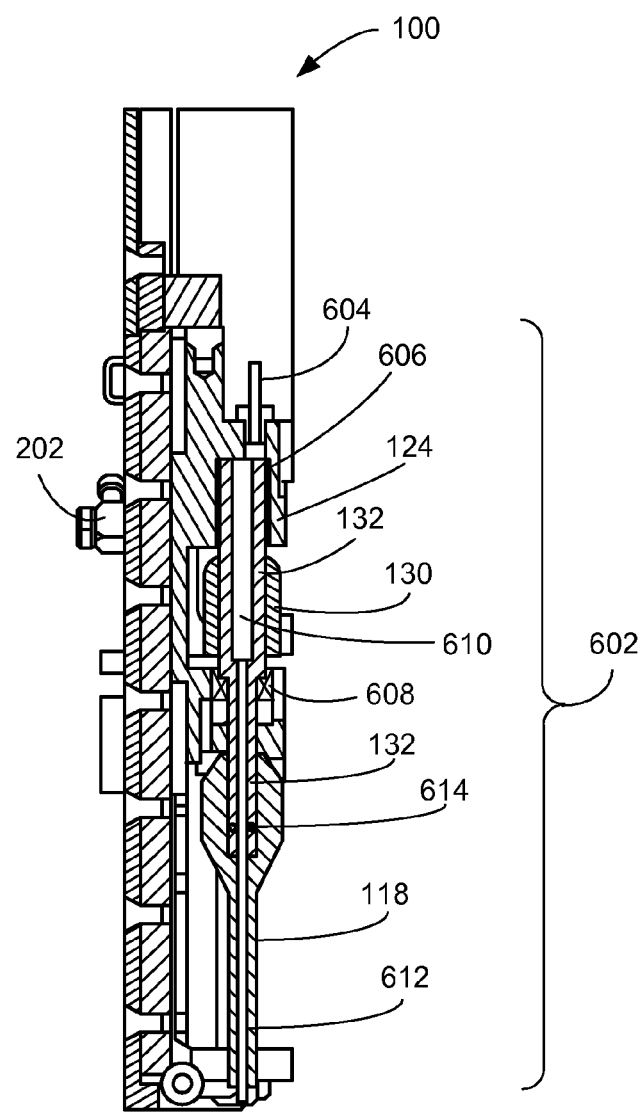
FIG. 6 is a cross-sectional view along line 6-6 of FIG. 5.

Referring now to FIG. 6, therein is shown a cross-sectional view along line 6-6 of FIG. 5. A primary feature illustrated by the cross-section of FIG. 6 is the internal configuration of a vacuum probe system 602 used to pick up small components by establishing a vacuum at the vacuum probe 118.

The vacuum probe system 602 includes the vacuum line 156 of FIG. 1 connected between the outlet of the vacuum fitting 202 of and a second vacuum fitting 604 installed on the motor carriage 124. The vacuum line 156 is not shown in FIG. 6 for clarity. The drive spindle 132 is supported in the motor carriage 124 by a sleeve bearing 606 and a ball bearing 608. The sleeve bearing 606 is also used as a vacuum seal. The drive spindle 132 contains an axial vacuum conduit 610 that is connected to the second vacuum fitting 604. The sleeve bearing 606 is coupled between the drive spindle 132 and the motor carriage 124. The sleeve bearing 606 surrounds and supports the drive spindle 132.

The driven pulley 130 is secured to the drive spindle 132. The bottom end of the drive spindle 132 is supported in the ball bearing 608 in the motor carriage 124 below the driven pulley 130. The drive spindle 132 extends into the vacuum probe 118 and connects to a vacuum conduit 612 in the vacuum probe 118. The vacuum conduit 612 extends to the bottom end of the vacuum probe 118 to allow pickup of devices by the application of vacuum at the vacuum fitting 202. The vacuum conduit 612 is secured in the drive spindle 132 using a vacuum o-ring 614 as a seal.

Figure 7:
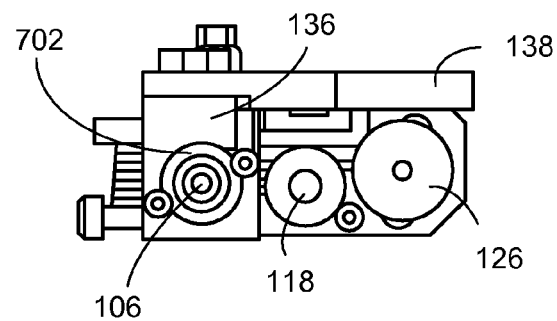
FIG. 7 is a bottom view of the pick and place system of FIG. 1.

Referring now to FIG. 7, therein is shown a bottom view of the pick and place system of FIG. 1. Elements that are predominantly seen from the bottom of the system include the driving pulley 126, the vacuum probe 118, a ball bearing 702 supporting the z-axis leadscrew 106 in the z-axis housing 136, and the base plate 138.

Figure 8:
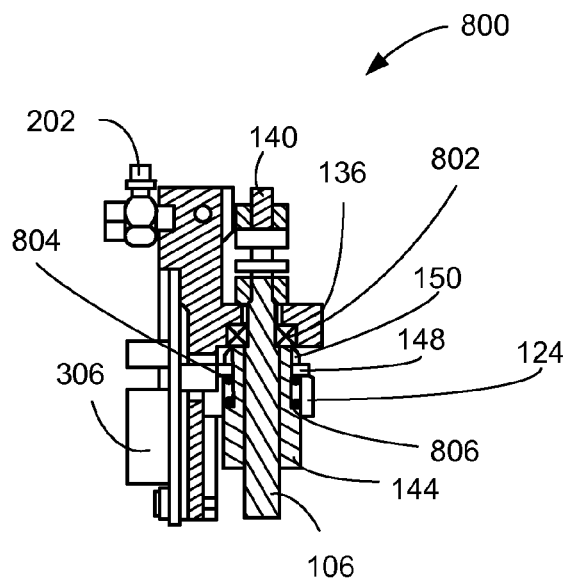
FIG. 8 is a cross-section along line 8-8 of FIG. 5.

Referring now to FIG. 8, therein is shown is a cross-section along line 8-8 of FIG. 5. The cross-section in FIG. 8 primarily shows the configuration of the top leadscrew assembly 800. The z-axis leadscrew 106 is supported by the z-axis housing 136 using a ball bearing 802. The vacuum fitting 202 is attached to the back side of the z-axis housing 136. The leadscrew nut 144 is secured to the motor carriage 124 through a semi-rigid connection using the washer 148, the jam nut 150, a first o-ring 804, and a second o-ring 806.

The leadscrew nut 144 is shown at the top position in the z-axis leadscrew 106. The home sensor 306 registers the position of the motor carriage 124, which moves up and down the z-axis leadscrew 106 as the z-axis motor 134 (not shown) rotates the z-axis leadscrew 106 through the coupler 140.

Figure 9:
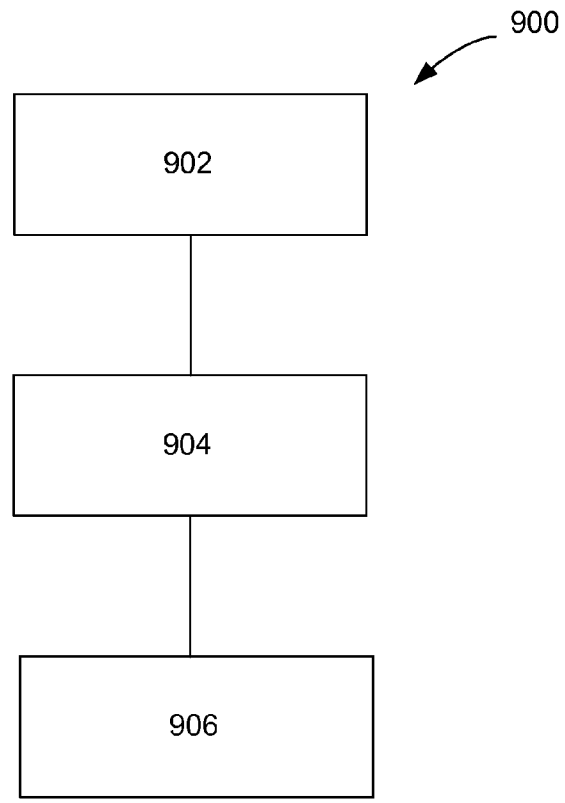
FIG. 9 is a flow chart of a system for a pick and place system in an embodiment of the present invention.

Referring now to FIG. 9, therein is shown a flow chart of a system for the pick and place system 900 in an embodiment of the present invention. The system 900 includes moving a vacuum probe in a linear direction using a linear actuator system in a block 902; moving the vacuum probe in a rotary direction using a rotary actuator system in a block 904; and applying a vacuum to the vacuum probe to pick up a micro-device after moving the vacuum probe in the linear direction or rotary direction for pickup and movement of the micro-device in a block 906.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a pick and place system comprising:
   moving a vacuum probe in a linear direction using a linear actuator system including a motor;
   moving the vacuum probe in a rotary direction around an axis of symmetry of the vacuum probe using a rotary actuator system including activating a timing belt coupled to the vacuum probe, the linear actuator system for moving the rotary actuator system vertically relative to the linear actuator system; and
   applying a vacuum to the vacuum probe to pick up a micro-device after moving the vacuum probe in the linear direction, rotary direction, or a combination thereof for picking, moving, and releasing of the micro-device, the vacuum probe coupled to a sleeve bearing for providing support and a vacuum seal.

2. The method of claim 1 further comprising sensing a position of the micro-device using a sensor cluster.

3. The method of claim 1 further comprising sensing movement of the linear actuator system using a home sensor.

4. The method of claim 1 further comprising sensing movement of the rotary actuator system using a theta motor in the rotary actuator system.

5. The method of claim 1 wherein applying vacuum to the vacuum probe is performed employing a vacuum probe system.

6. A method of operation of a pick and place system comprising:
   moving a vacuum probe in a linear direction using a linear actuator system including a z-axis motor;
   moving the vacuum probe in a rotary direction around an axis of symmetry of the vacuum probe using a theta motor including activating a timing belt coupled to the vacuum probe, the linear actuator system for moving the rotary actuator system vertically relative to the linear actuator system; and
   applying a vacuum to the vacuum probe using a vacuum probe system to pick up a micro-device after moving the vacuum probe in the linear direction, rotary direction, or a combination thereof for picking, moving, and releasing of the micro-device, the vacuum probe coupled to a sleeve bearing for providing support and a vacuum seal.

7. The method of claim 6 wherein moving the vacuum probe in a linear direction using the z-axis motor is performed by coupling the z-axis motor to a z-axis leadscrew that moves a leadscrew nut attached to a rotary actuator system incorporating the vacuum probe.

8. The method of claim 6 wherein moving the vacuum probe in a rotary direction using the theta motor is performed by coupling the rotation of the theta motor to a drive spindle attached to the vacuum probe.

9. The method of claim 6 further comprising sensing movement of the linear actuator system using a home sensor.

10. The method of claim 6 further comprising sensing movement of the rotary actuator system using a theta motor in the rotary actuator system.

11. A pick and place system comprising:
    a linear actuator system including a motor;
    a rotary actuator system coupled to the linear actuator system, the linear actuator system for moving the rotary actuator system vertically relative to the linear actuator system;
    a vacuum probe positioned by the linear actuator system and movable in a rotary direction around an axis of symmetry of the vacuum probe by the rotary actuator system including activating a timing belt coupled to the vacuum probe for picking, moving, and releasing of a micro-device; and
    a sleeve bearing coupled to the vacuum probe, for providing support and a vacuum seal.

12. The pick and place system of claim 11 further comprising a position of the micro-device sensed by a sensor cluster.

13. The pick and place system of claim 11 further comprising a home sensor for sensing movement of the linear actuator system.

14. The pick and place system of claim 11 wherein the rotary actuator system incorporates a theta motor for actuating and sensing movement of the rotary actuator system.

15. The pick and place system of claim 11 wherein the vacuum probe is a component of a vacuum probe system.

16. The pick and place system of claim 11 wherein:
    the linear actuator system includes a z-axis motor; and
    the rotary actuator system includes a theta motor.

17. The pick and place system of claim 16 wherein:
    the z-axis motor is coupled to a z-axis leadscrew; and
    the z-axis leadscrew incorporates a leadscrew nut attached to the rotary actuator system incorporating the vacuum probe.

18. The pick and place system of claim 16 wherein the theta motor is coupled to a drive spindle attached to the vacuum probe.

19. The pick and place system of claim 16 further comprising a home sensor for sensing movement of the linear actuator system.

20. The pick and place system of claim 16 further comprising a driving pulley, the timing belt, and a driven pulley for coupling the theta motor to a drive spindle attached to the vacuum probe.

* * * * *